(12) United States Patent
He et al.

(10) Patent No.: US 11,193,010 B2
(45) Date of Patent: Dec. 7, 2021

(54) POLYOLEFIN COMPOSITIONS FOR PHOTOVOLTAIC ENCAPSULANT FILMS

(71) Applicant: Dow Global Technologies LLC, Midland, MI (US)

(72) Inventors: Chao He, Shanghai (CN); Yunfeng Yang, Shanghai (CN); Weiming Ma, Shanghai (CN); Hongyu Chen, Shanghai (CN); Yuyan Li, Shanghai (CN); Hong Yang, Shanghai (CN)

(73) Assignee: Dow Global Technologies LLC, Midland, MI (US)

( * ) Notice: Subject to any disclaimer, the term of this patent is extended or adjusted under 35 U.S.C. 154(b) by 35 days.

(21) Appl. No.: 16/760,688

(22) PCT Filed: Oct. 31, 2017

(86) PCT No.: PCT/CN2017/108581
§ 371 (c)(1),
(2) Date: Apr. 30, 2020

(87) PCT Pub. No.: WO2019/084773
PCT Pub. Date: May 9, 2019

(65) Prior Publication Data
US 2020/0347212 A1  Nov. 5, 2020

(51) Int. Cl.
| | | |
|---|---|---|
| *C08L 23/08* | (2006.01) | |
| *C08K 5/14* | (2006.01) | |
| *C08K 5/549* | (2006.01) | |
| *C08K 5/5419* | (2006.01) | |
| *H01L 31/048* | (2014.01) | |
| *C08J 5/18* | (2006.01) | |
| *C08K 5/5445* | (2006.01) | |
| *C08J 3/24* | (2006.01) | |

(52) U.S. Cl.
CPC ............ *C08L 23/0815* (2013.01); *C08J 5/18* (2013.01); *C08K 5/14* (2013.01); *C08K 5/549* (2013.01); *C08K 5/5419* (2013.01); *C08K 5/5445* (2021.01); *H01L 31/0481* (2013.01); *C08J 3/243* (2013.01); *C08L 2203/206* (2013.01)

(58) Field of Classification Search
CPC ......... C08L 23/00–23; C08L 23/10–23; C08L 23/16–24; C08L 25/00–10; C09D 123/00–23; C09D 123/10–23; C09D 123/16–24; C09D 25/00–10; C08K 5/5455; C08K 5/549; H01L 31/0481
See application file for complete search history.

(56) References Cited

U.S. PATENT DOCUMENTS

| | | |
|---|---|---|
| 8,557,912 B2 | 10/2013 | Chung et al. |
| 9,574,032 B2 | 2/2017 | Choi et al. |
| 2011/0290317 A1 | 12/2011 | Naumovitz et al. |
| 2013/0167926 A1 | 7/2013 | Niemann et al. |

OTHER PUBLICATIONS

Liu, New Chemical Materials, 2006, p. 78-80, vol. 34., No. 10.
PCT/CN2017/108581, International Search Report and Written Opinion dated Jun. 27, 2018.

*Primary Examiner* — Marc S Zimmer
(74) *Attorney, Agent, or Firm* — Cheney Huang

(57) ABSTRACT

The present disclosure relates to an encapsulant film made from a curable composition comprising: (A) a polyolefin polymer; (B) an organic peroxide; (C) a silane coupling agent; and (D) a co-agent comprising a monocyclic organosilazane of formula (I).

17 Claims, 2 Drawing Sheets

POLYOLEFIN COMPOSITIONS FOR PHOTOVOLTAIC ENCAPSULANT FILMS

FIELD OF THE DISCLOSURE

This disclosure relates to polyolefin polymer compositions for photovoltaic (PV) encapsulant films. In one aspect, the disclosure relates to polyolefin polymer compositions that provide for shorter process times for forming encapsulant films. In another aspect, the disclosure relates to PV encapsulant films comprising a polyolefin polymer composition and electronic devices including the same.

BACKGROUND

The global demand for alternative energy has resulted in large increases in solar panel and PV module production over the last decade. The solar cells (also called PV cells) that convert solar energy into electrical energy are extremely fragile and must be surrounded by a durable encapsulant film. Two main functions of the encapsulant film are to (1) bond the solar cell to the glass coversheet and the backsheet and (2) protect the PV module from environmental stress (e.g., moisture, temperature, shock, vibration, electrical isolation, etc.). Current encapsulant films are primarily made of ethylene vinyl acetate (EVA) because EVA shows a good balance of properties necessary for encapsulant films. EVA is a type of ethylene/unsaturated carboxylic ester copolymer in which the unsaturated carboxylic ester comonomer is a vinyl carboxylate.

Certain polyolefin polymers, such as polyolefin elastomers (POE) that are not ethylene/unsaturated carboxylic ester copolymers, have been identified as an alternative to EVA for forming encapsulant films and have, in comparison to EVA, advantages in, e.g., electric resistivity, wet and heat stability, and weather resistance. However, conventional POE-based compositions have longer process times for forming encapsulant films compared to EVA-based compositions. Consequently, the art recognizes a need for novel POE-based compositions that provide for short process times for forming encapsulant films while maintaining good performance for curing, adhesion, volume resistivity, etc.

SUMMARY

In certain embodiments, this disclosure is directed to a curable composition for forming an encapsulant film, the composition comprising:
(a) a polyolefin polymer;
(b) an organic peroxide;
(c) a silane coupling agent; and
(d) a co-agent comprising a monocyclic organosilazane of formula (I):
[$R^1,R^2SiN(R^3)_{2/2}]_n$ (I), wherein subscript n is an integer greater than or equal to 3; each $R^1$ is independently a ($C_2$-$C_4$)alkenyl; and each $R^2$ and $R^3$ is independently H, ($C_1$-$C_4$)alkyl, phenyl, or $R^1$.

In further embodiments, this disclosure is directed to an encapsulant film comprising a crosslinked polymeric composition comprising the reaction product of:
(a) a polyolefin polymer;
(b) an organic peroxide;
(c) a silane coupling agent; and
(d) a co-agent comprising a monocyclic organosilazane of formula (I):
[$R^1,R^2SiN(R^3)_{2/2}]_n$ (I), wherein subscript n is an integer greater than or equal to 3; each $R^1$ is independently a ($C_2$-$C_4$)alkenyl; and each $R^2$ and $R^3$ is independently H, ($C_1$-$C_4$)alkyl, phenyl, or $R^1$.

DEFINITIONS

Figure 1:
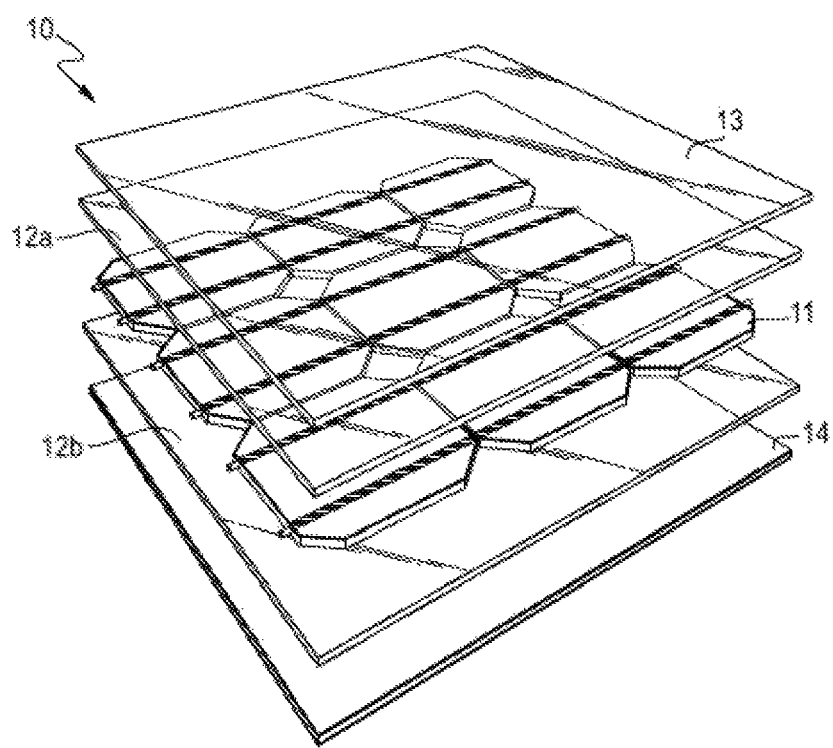
FIG. 1 is an exploded perspective view of an exemplary photovoltaic module.

Any reference to the Periodic. Table of Elements is that as published by CRC Press, Inc., 1990-1991. Reference to a group of elements in this table is by the new notation for numbering groups.

For purposes of United States patent practice, the contents of any referenced patent, patent application or publication are incorporated by reference in their entirety (or its equivalent US version is so incorporated by reference) especially with respect to the disclosure of definitions (to the extent not inconsistent with any definitions specifically provided in this disclosure) and general knowledge in the art.

The numerical ranges disclosed herein include all values from, and including, the lower and upper value. For ranges containing explicit values (e.g., 1, or 2, or 3 to 5, or 6, or 7), any subrange between any two explicit values is included (e.g., 1 to 2; 2 to 6; 5 to 7; 3 to 7; 5 to 6; etc.).

Unless stated to the contrary, implicit from the context, or customary in the art, all parts and percents are based on weight and all test methods are current as of the filing date of this disclosure.

Unless stated to the contrary, all test methods are current as of the filing date of this disclosure.

"Blend", "polymer blend" and like terms mean a composition of two or more polymers. Such a blend may or may not be miscible. Such a blend may or may not be phase separated. Such a blend may or may not contain one or more domain configurations, as determined from transmission electron spectroscopy, light scattering, x-ray scattering, and any other method used to measure and/or identify domain configurations. Blends are not laminates, but one or more layers of a laminate may contain a blend.

"Composition," as used herein, includes a mixture of materials which comprise the composition, as well as reaction products and decomposition products formed from the materials of the composition.

The terms "comprising," "including," "having," and their derivatives, are not intended to exclude the presence of any additional component, step or procedure, whether or not the same is specifically disclosed. In order to avoid any doubt, all compositions claimed through use of the term "comprising" may include any additional additive, adjuvant, or compound, whether polymeric or otherwise, unless stated to the contrary. In contrast, the term, "consisting essentially of" excludes from the scope of any succeeding recitation any other component, step or procedure, excepting those that are not essential to operability. The term "consisting of" excludes any component, step or procedure not specifically listed. The term "or," unless stated otherwise, refers to the listed members individual as well as in any combination. Use of the singular includes use of the plural and vice versa.

"Directly contacts" refers to a layer configuration whereby a first layer is located immediately adjacent to a second layer and no intervening layers or no intervening structures are present between the first layer and the second layer.

The term "coagent" means a compound that enhances crosslinking, i.e., a curing coagent. The term "coagent," "co-agent," "crosslinking coagent," and "crosslinking co-agent" are used interchangeably herein. "Conventional coagent" is an acyclic or cyclic compound that enhances crosslinking and contains carbon atoms in its respective backbone or ring substructure. Thus, the backbone or ring substructure of the conventional coagent is based on carbon (carbon-based substructure). In contrast, a silicon-based coagent means an acyclic or cyclic compound that enhances crosslinking and that contains silicon atoms in its respective backbone or ring substructure. The monocyclic organosilazane of formula (I) is a cyclic silicon-based coagent. Use of a conventional coagent in a POE-based composition is representative of the state of the art.

The terms "curing" and "crosslinking" are used interchangeably herein to mean forming a crosslinked product (network polymer)

"Polymer," as used herein, refers to a polymeric compound prepared by polymerizing monomers, whether of the same or a different type. The generic term polymer thus embraces the term homopolymer (employed to refer to polymers prepared from only one type of monomer, with the understanding that trace amounts of impurities can be incorporated into the polymer structure), and the term interpolymer as defined herein. Trace amounts of impurities, for example, catalyst residues, may be incorporated into and/or within the polymer.

"Interpolymer," as used herein, refers to polymers prepared by the polymerization of at least two different types of monomers. The generic term interpolymer thus includes copolymers (employed to refer to polymers prepared from two different types of monomers), and polymers prepared from more than two different types of monomers.

"Propylene-based," "a propylene-based polymer," "polypropylene," and like terms refer to a polymer that contains 50 weight percent (wt %) to 100 wt % of polymerized propylene monomers (based on the total amount of polymerizable monomers) and, optionally, may contain at least one comonomer. Such terms include propylene homopolymers and propylene interpolymers (meaning units derived from propylene and one or more comonomers, such as propylene/alpha-olefin interpolymers).

"Ethylene-based," "an ethylene-based polymer," "polyethylene," and like terms refer to a polymer that contains 50 wt % to 100 wt % of polymerized ethylene monomers (based on the total amount of polymerizable monomers) and, optionally, may contain at least one comonomer. Such terms include ethylene homopolymers and ethylene interpolymers (meaning units derived from ethylene and one or more comonomers, such as ethylene/alpha-olefin interpolymers).

"Alpha-olefins" as used herein are hydrocarbon molecules composed of hydrocarbon molecules having an ethylenic unsaturation at the primary (alpha) position. For example, "$(C_3-C_{20})$alpha-olefins," as used herein, are hydrocarbon molecules composed of hydrocarbon molecules comprising (i) only one ethylenic unsaturation, this unsaturation located between the first and second carbon atoms, and (ii) at least 3 carbon atoms, or of 3 to 20 carbon atoms. For example, $(C_3-C_{20})$ alpha-olefin, as used herein, refers to $H_2C=C(H)-R$, wherein R is a straight chain $(C_1-C_{18})$alkyl group. $(C_1-C_{18})$alkyl group is a monovalent unsubstituted saturated hydrocarbon having from 1 to 18 carbon atoms. Non-limiting examples of R are methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, and octadecyl. Non-limiting examples of the $(C_3-C_{20})$ alpha-olefin include propylene, 1-butene, 1-pentene, 1-hexene, 1-octene, 1-dodecene, and mixtures of two or more of these monomers. The $(C_3-C_{20})$ alpha-olefin may have a cyclic structure such as cyclohexane or cyclopentane, resulting in an alpha-olefin such as 3-cyclohexyl-1-propene (allyl cyclohexane) and vinyl cyclohexane. The $(C_3-C_{20})$ alpha-olefin may be used as a comonomer with ethylene monomer.

The term "ethylene-containing polymer" means a macromolecule containing repeat units derived from $H_2C=C=CH_2$.

"Polyolefin elastomer" or "POE" refer to an elastomeric polymer containing equal to or greater than 50 wt % of polymerized alpha-olefin monomers (including ethylene). "Polyolefin elastomer" include but are not limited to the ethylene-based polymers and propylene-based polymers described herein. As used herein, the term "polyolefin elastomer" excludes ethylene-vinyl acetate (EVA) copolymers.

"Non-polar polymer" and like terms refer to a polymer that does not have a permanent dipole, i.e., the polymer does not have a positive end and a negative end, and is void of heteroatoms and functional groups. "Functional group" and like terms refer to a moiety or group of atoms responsible for giving a particular compound its characteristic reactions. Non-limiting examples of functional groups include heteroatom-containing moieties, oxygen-containing moieties (e.g., alcohol, aldehyde, ester, ether, ketone, and peroxide groups), and nitrogen-containing moieties (e.g., amide, amine, azo, imide, imine, nitrate, nitrile, and nitrite groups). A "heteroatom" is an atom other than carbon or hydrogen.

"Photovoltaic cell", "PV cell" and like terms mean a structure that contains one or more photovoltaic effect materials of any of several inorganic or organic types which are known in the art. For example, commonly used photovoltaic effect materials include one or more of the known photovoltaic effect materials including but not limited to crystalline silicon, polycrystalline silicon, amorphous silicon, copper indium gallium (di)selenide (CIGS), copper indium selenide (CIS), cadmium telluride, gallium arsenide, dye-sensitized materials, and organic solar cell materials. As shown in FIG. 1, PV cells are typically employed in a laminate structure and have at least one light-reactive surface that converts the incident light into electric current. Photovoltaic cells are well known to practitioners in this field and are generally packaged into photovoltaic modules that protect the cell(s) and permit their usage in their various application environments, typically in outdoor applications. PV cells may be flexible or rigid in nature and include the photovoltaic effect materials and any protective coating surface materials that are applied in their production as well as appropriate wiring and electronic driving circuitry.

"Photovoltaic module", "PV module" and like terms refer to a structure including a PV cell. A PV module may also include a cover sheet, front encapsulant film, rear encapsulant film and backsheet, with the PV cell sandwiched between the front encapsulant film and rear encapsulant film.

"Room temperature" refers to a temperature range of about 20 to about 25° C.

"Further processing," "further processed," and like terms refer to manufacturing process steps for polyolefins, including but not limited to compounding, blending, melt blending, extrusion (e.g., film extrusion), kneading, imbibing, injecting, and molding (e.g., injection molding, compression molding, blow molding, etc.). Non-limiting examples of suitable compounding equipment include internal batch mixers (e.g., BANBURY and BOLLING internal mixer) and continuous single or twin screw mixers (e.g., FARREL continuous mixer, BRABENDER single screw mixer, WERNER and PFLEIDERER twin screw mixers and BUSS kneading continuous extruder). The type of mixer utilized, and the operating conditions of the mixer, can affect properties of the composition such as viscosity, volume resistivity, and extruded surface smoothness.

DETAILED DESCRIPTION

Currently, encapsulant films are primarily made of EVA. However, there is strong interest in replacing EVA-based compositions with polyolefin polymer compositions that do not include EVA (e.g., polyolefin elastomers (POE) as defined herein) due to certain advantages they can provide for encapsulant films (including but not limited to electric resistivity, wet and heat stability, and weather resistance). However, a challenge that exists for forming POE-based encapsulant films is the longer process time relative to the formation of EVA-based encapsulant films. Specifically, in the process for forming an EVA-based or POE-based encapsulant film, an initial step may be to soak the EVA or POE with a curing package (including a peroxide, a silane coupling agent, and a crosslinking co-agent). For POE, this initial soaking step can take much longer (e.g., up to 16 hours) compared to EVA (e.g., around 1 hour) when using a conventional curing package. Accordingly, the longer soaking time for POE can severely limit productivity and increase manufacturing costs for forming POE-based encapsulant films. To that end, this disclosure provides for a surprising and unexpected shortening of the time required for soaking POE with a curing package when conventional crosslinking co-agents (e.g., triallyl isocyanurate (TAIC)) are replaced with co-agents comprising monocyclic organosilazanes of formula (I).

Composition

The composition of this disclosure ("the present composition") is a curable composition for forming encapsulant films, the composition comprising: (A) a polyolefin polymer; (B) an organic peroxide; (C) a silane coupling agent; and (D) a co-agent comprising a monocyclic organosilazane of formula (I).

(A) Polyolefin Polymer

The present composition comprises a polyolefin polymer. In certain embodiments, the present composition comprises from 80 wt % to 99.99 wt % (e.g., from 80 wt % to 99.88 wt %, from 85 wt % to 99.88 wt %, from 88 wt % to 99.88 wt %, from 90 wt % to 99 wt %, from 95 wt % to 99 wt %, from 97 wt % to 99 wt %, from 97.50 wt % to 98.50 wt %, and/or from 97.75 wt % to 98.25 wt %) of the polyolefin polymer. Said in another way, in certain embodiments, the present composition comprises from 80 wt %, or 85 wt %, or 88 wt %, or 90 wt %, or 95 wt %, or 97 wt %, or 97.50 wt %, or 97.75 wt % to 98.25 wt %, or 98.5 wt %, or 99 wt %, or 99.88 wt %, or 99.99 wt % of the polyolefin polymer.

In certain embodiments, the polyolefin polymer is a polyolefin elastomer as defined herein. In further embodiments, the polyolefin polymer is a non-polar polyolefin elastomer.

In some embodiments, the polyolefin polymer is an ethylene-based polymer comprising 50 to 100 wt % ethylenic monomeric units, 50 to 0 wt % ($C_3$-$C_{20}$) alpha-olefin-derived comonomeric units, and optionally 20 to 0 wt % dienic comonomeric units, wherein the total weight percent is 100 wt %. The diene used to make the dienic comonomeric units may be 1,3-butadiene, 1,5-hexadiene, 1,7-octadiene, ethylidene norbornene, dicyclopentadiene, or vinyl norbornene.

In some embodiments, the polyolefin polymer is a propylene-based polymer comprising 50 to 100 wt % propylenic monomeric units, 50 to 0 wt % of ethylenic or ($C_4$-$C_{20}$) alpha-olefin-derived comonomeric units, and optionally 20 to 0 wt % dienic comonomeric units, wherein the total weight percent is 100 wt %. The diene used to make the dienic comonomeric units may be 1,3-butadiene, 1,5-hexadiene, 1,7-octadiene, ethylidene norbornene, dicyclopentadiene, or vinyl norbornene.

In some embodiments, the polyolefin polymer is a poly(($C_3$-$C_{20}$)alpha-olefin) homopolymer containing 99 to 100 wt ($C_3$-$C_{20}$)alpha-olefin monomeric units or a poly(($C_3$-$C_{20}$) alphaolefin) copolymer containing 99 to 100 wt % of at least two different ($C_3$-$C_{20}$)alpha-olefin monomeric/comonomeric units.

In certain embodiments, the polyolefin polymer is an ethylene/alpha-olefin interpolymer. Ethylene/alpha-olefin interpolymers can be random or block interpolymers. Block interpolymers include multi-block copolymers and di-block copolymers. Non-limiting examples of suitable ethylene/alpha-olefin interpolymers include ethylene/propylene, ethylene/butene, ethylene/1-hexene, ethylene/1-octene, ethylene/propylene/1-octene, ethylene/propylene/1-butene, and ethylene/butene/1-octene interpolymers. In some embodiments, the ethylene/alpha-olefin interpolymer is an ethylene/alpha-olefin copolymer. Non-limiting examples of suitable ethylene/alpha-olefin copolymers include ethylene/propylene copolymers, ethylene/butene copolymers, ethylene/1-hexene copolymers, and ethylene/1-octene copolymers.

In certain embodiments, the polyolefin polymer is a propylene/alpha-olefin interpolymer, where "alpha-olefin" includes ethylene. In some embodiments, the propylene/alpha-olefin interpolymer is a propylene/alpha-olefin copolymer.

In certain embodiments, the polyolefin polymer has a density from 0.850 g/cc to 0.900 g/cc (e.g., from 0.855 g/cc to 0.900 g/cc, from 0.860 g/cc to 0.900 g/cc, from 0.865 g/cc to 0.900 g/cc, from 0.870 g/cc to 0.890 g/cc, from 0.875 g/cc to 0.890 g/cc, from 0.875 g/cc to 0.885 g/cc, and/or from 0.880 g/cc to 0.885 g/cc) according to ASTM D792. Said in another way, the polyolefin polymer has a density from 0.850 g/cc, or 0.855 g/cc, or 0.860 g/cc, or 0.865 g/cc, or 0.870 g/cc, or 0.875 g/cc, or 0.880 g/cc to 0.885 g/cc, or 0.890 g/cc, or 0.900 g/cc according to ASTM D792.

In certain embodiments, the polyolefin polymer has a melt index (MI) from 1 g/10 min to 100 g/10 min (e.g., from 1 g/10 min to 75 g/10 min, from 1 g/10 min to 50 g/10 min, 1 g/10 min to 45 g/10 min, from 1 g/10 min to 40 g/10 min, from 1 g/10 min to 35 g/10 min, from 1 g/10 min to 30 g/10 min, from 5 g/10 min to 25 g/10 min, from 10 g/10 min to 25 g/10 min, from 15 g/10 min to 25 g/10 min, from 15 g/10 min to 20 g/10 min, and/or from 18 g/10 min to 20 g/10 min) according to ASTM D1238, at 190° C./2.16 kg. Said in another way, in certain embodiments, the polyolefin polymer has a melt index from 1 g/10 min, or 5 g/10 min, or 10 g/10 min, or 15 g/10 min, or 18 g/10 min to 20 g/10 min, or 25 g/10 min, or 30 g/10 min, or 35 g/10 min, or 40 g/10 min, or 45 g/10 min, or 50 g/10 min, or 75 g/10 min, or 100 g/10 min according to ASTM D1238, at 190° C./2.16 kg.

In some embodiments, the polyolefin polymer has a melting point from 40° C. to 125° C. In some embodiments, the polyolefin polymer has a melting point from 40° C., or 45° C., or 50° C., or 55° C. to 60° C., or 65° C., or 70° C., or 80° C., or 90° C., or 95° C., or 100° C., or 110° C., or 120° C., or 125° C.

In some embodiments, the polyolefin polymer has a glass transition temperature (Tg) from −35° C. to −100° C. In some embodiments, the glass transition temperature (Tg) of the polyolefin polymer is from −35° C., or −40° C., or −45° C. or −50° C. to −80° C., or −85° C., or −90° C., or −95° C., or −100° C.

In certain embodiments, the polyolefin polymer is a non-polar ethylene/alpha-olefin interpolymer.

In certain embodiments, the polyolefin polymer is an ethylene/alpha-olefin interpolymer having one, some, or all of the following properties:

(i) a density of 0.850 g/cc, or 0.855 g/cc, or 0.860 g/cc, or 0.865 g/cc, or 0.870 g/cc, or 0.875 g/cc, or 0.880 g/cc to 0.885 g/cc, or 0.890 g/cc, or 0.900 g/cc;

(ii) a melt index of 1 g/10 min, or 5 g/10 min, or 10 g/10 min, or 15 g/10 min, or 18 g/10 min to 20 g/10 min, or 25 g/10 min, or 30 g/10 min, or 35 g/10 min, or 40 g/10 min, or 45 g/10 min, or 50 g/10 min, or 75 g/10 min, or 100 g/10 min; and/or (iii) a melting point (Tm) of 40° C., or 45° C., or 50° C., or 55° C. to 60° C., or 65° C., or 70° C., or 80° C., or 90° C., or 95° C., or 100° C., or 110° C., or 120° C., or 125° C.

The polyolefin polymer may be a blend or combination of two or more of the foregoing embodiments. The polyolefin polymer may also be blended or diluted with one or more other polymers.

The polyolefin polymer may be made by any suitable process known in the art. Any conventional or hereafter discovered production process for producing polyolefin polymers may be employed for preparing the polyolefin polymer of this disclosure. Suitable production processes comprise one or more polymerization reactions, such as high pressure polymerization processes or coordination polymerization processes conducted using one or more polymerization catalysts, including but not limited to Ziegler-Natta, chromium oxide, metallocene, constrained geometry, post-metallocene catalysts. Suitable temperatures are from 0° to 250° C., or 30° or 200° C. Suitable pressures are from atmospheric pressure (101 kPa) to 10,000 atmospheres (approximately 1,013 MegaPascals ("MPa")). In most polymerization reactions, the molar ratio of catalyst to polymerizable olefins (monomer/comonomer) employed is from $10^{-12}$:1 to $10^{-1}$:1, or from $10^{-9}$:1 to $10^5$:1.

Non-limiting examples of the polyolefin polymer include ENGAGE™ Polyolefin Elastomers from The Dow Chemical Company, AFFINITY™ Polyolefin Plastomers from The Dow Chemical Company, INFUSE™ Olefin Block Copolymers from The Dow Chemical Company, INTUNE™ PP-based Olefin Block Copolymers from The Dow Chemical Company, EXACT™ resins from Exxon Chemical Company, TAFMER™ resins from Mitsui Chemicals, LUCENE™ resins from LG Chemical, EASTOFLEX™ resins from Eastman Chemical Company, and FLEX-OMER™ resins from The Dow Chemical Company.

(B) Organic Peroxide

The present composition comprises an organic peroxide. In certain embodiments, the present composition comprises from 0.1 wt % to 3 wt % (e.g., from 0.1 wt % to 2.5 wt %, from 0:1 wt % to 2 wt %, from 0.5 wt % to 1.5 wt %, and/or from 1 wt % to 1.5 wt %) of an organic peroxide. Said in another way, the present composition comprises from 0.1 wt %, or 0.5 wt %, or 1 wt to 1.5 wt %, or 2 wt %, or 2.5 wt %, or 3 wt % of an organic peroxide.

In certain embodiments, the organic peroxide is a molecule containing carbon atoms, hydrogen atoms, and two or more oxygen atoms, and having at least one —O—O— group, with the proviso that when there are more than one —O—O— group, each —O—O— group is bonded indirectly to another —O—O— group via one or more carbon atoms, or collection of such molecules.

The organic peroxide may be a monoperoxide of formula $R^O$—O—O—$R^O$, wherein each $R^O$ independently is a ($C_1$-$C_{20}$)alkyl group or ($C_6$-$C_{20}$)aryl group. Each ($C_1$-$C_{20}$)alkyl group independently is unsubstituted or substituted with 1 or 2 ($C_6$-$C_{12}$)aryl groups. Each ($C_6$-$C_{20}$)aryl group is unsubstituted or substituted with 1 to 4 ($C_1$-$C_{10}$)alkyl groups. Alternatively, the organic peroxide may be a diperoxide of formula $R^O$—O—O—R—O—O—$R^O$, wherein R is a divalent hydrocarbon group such as a ($C_2$-$C_{10}$)alkylene, ($C_3$-$C_{10}$)cycloalkylene, or phenylene, and each $R^O$ is as defined above.

Non-limiting examples of suitable organic peroxides include dicumyl peroxide; lauryl peroxide; benzoyl peroxide; tertiary butyl perbenzoate; di(tertiary-butyl) peroxide; cumene hydroperoxide; 2,5-dimethyl-2,5-di(t-butyl-peroxy) hexyne-3; 2,-5-di-methyl-2,5-di(t-butyl-peroxy)hexane; tertiary butyl hydroperoxide; isopropyl percarbonate; alpha, alpha'-bis(tertiary-butylperoxy)diisopropylbenzene; t-butylperoxy-2-ethylhexyl-monocarbonate; 1,1-bis(t-butylperoxy)-3,5,5-trimethyl cyclohexane; 2,5-dimethyl-2,5-dihydroxyperoxide; t-butylcumylperoxide; alpha,alpha'-bis(t-butylperoxy)-p-diisopropyl benzene; bis(1,1-dimethylethyl) peroxide; bis(1,1-dimethylpropyl) peroxide; 2,5-dimethyl-2,5-bis(1,1-dimethylethylperoxy) hexane; 2,5-dimethyl-2,5-bis(1,1-dimethylethylperoxy) hexyne; 4,4-bis (1,1-dimethylethylperoxy) valeric acid; butyl ester; 1,1-bis (1,1-dimethylethylperoxy)-3,3,5-trimethylcyclohexane; benzoyl peroxide; tert-butyl peroxybenzoate; di-tert-amyl peroxide ("DTAP"); bis(alpha-t-butyl-peroxyisopropyl) benzene ("BIPB"); isopropylcumyl t-butyl peroxide; t-butylcumylperoxide; di-butyl peroxide; 2,5-bis(tbutylperoxy)-2,5-dimethylhexane; 2,5-bis(t-butylperoxy)-2,5-dimethyl-hexyne-3,1,1-bis(tbutylperoxy)-3,3,5-trimethylcyclohexane; isopropylcumyl cumylperoxide; butyl 4,4-di(tertbutylperoxy) valerate; di(isopropylcumyl) peroxide; and the like.

Non-limiting examples of suitable commercially available organic peroxides include TRIGONOX® from AkzoNobel and LUPEROX® from ARKEMA.

(C) Silane Coupling Agent

The present composition comprises a silane coupling agent. In certain embodiments, the present composition comprises from 0.01 wt % to 2 wt % (e.g., from 0.05 wt % to 1.5 wt %, from 0.1 wt % to 1 wt %, from 0.15 wt % to 0.5 wt %, from 0.2 wt % to 0.4 wt %, and/or from 0.25 wt % to 0.3 wt %) of a silane coupling agent. Said in another way, the present composition comprises from 0.01 wt %, or 0.05 wt %, or 0.1 wt %, or 0.15 wt %, or 0.2 wt %, or 0.25 wt % to 0.3 wt %, or 0.4 wt %, or 0.5 wt %, or 1 wt %, or 1.5 wt %, or 2 wt % of a silane coupling agent.

In some embodiments, the silane coupling agent contains at least one alkoxy group. Non-limiting examples of suitable silane coupling agents include γ-chloropropyl trimethoxysilane, vinyl trimethoxysilane, vinyl triethoxysilane, vinyl-tris-(β-methoxy)silane, allyltrimethoxysilane, γ-methacryloxypropyl trimethoxysilane, β-(3,4-ethoxy-cyclohexyl) ethyl trimethoxysilane, γ-glycidoxypropyl trimethoxysilane, γ-mercaptopropyltrimethoxysilane, γ-aminopropyl trimethoxysilane, N-β-(aminoethyl)-γ-aminopropyl trimethoxysilane, and 3-(trimethoxysilyl)propylmethacrylate.

In some embodiments, the silane coupling agent is vinyl trimethoxysilane or 3-(trimethoxysilyl)propylmethacrylate or allyltrimethoxysilane.

(D) Co-Agent

The present composition comprises a co-agent comprising a monocyclic organosilazane of formula (I): $[R^1,R^2SiN(R^3)_{2/2}]_n$ (I), wherein subscript n is an integer greater than or equal to 3; each $R^1$ is independently a $(C_2-C_4)$alkenyl; and each $R^2$ and $R^3$ is independently H, $(C_1-C_4)$alkyl, phenyl, or $R^1$.

In certain embodiments, the monocyclic, organosilazane of formula (I) is further described by any one of the following limitations: (i) subscript n is 3; (ii) each $R^1$ is independently a $(C_2-C_3)$alkenyl; and each $R^2$ and $R^3$ is independently H, $(C_1-C_2)$alkyl, or $(C_2-C_3)$alkenyl; (iii) each $R^1$ is vinyl; and each $R^2$ and $R^3$ is independently $(C_1-C_2)$alkyl; (iv) each $R^1$ is vinyl; and each $R^2$ and $R^3$ is methyl; (v) each $R^1$ is allyl; and each $R^2$ and $R^3$ is independently $(C_1-C_2)$alkyl; (vi) each $R^1$ is allyl; and each $R^2$ and $R^3$ is methyl;

In certain embodiments, the monocyclic organosilazane of formula (I) is further described by any one of the following limitations: (i) subscript n is 4; (ii) each $R^1$ is independently a $(C_2-C_3)$alkenyl; and each $R^2$ and $R^3$ is independently H, $(C_1-C_2)$alkyl, or $(C_2-C_3)$alkenyl; (iii) each $R^1$ is vinyl; and each $R^2$ and $R^3$ is independently $(C_1-C_2)$alkyl; (iv) each $R^1$ is vinyl; and each $R^2$ and $R^3$ is methyl; (v) each $R^1$ is allyl; and each $R^2$ and $R^3$ is independently $(C_1-C_2)$alkyl; (vi) each $R^1$ is allyl; and each $R^2$ and $R^3$ is methyl;

In certain embodiments, the monocyclic organosilazane of formula (I) is further described by any one of the following limitations: (i) subscript n is 5 or 6; (ii) each $R^1$ is independently a $(C_2-C_3)$alkenyl; and each $R^2$ and $R^3$ is independently H, $(C_1-C_2)$alkyl, or $(C_2-C_3)$alkenyl; (iii) each $R^1$ is vinyl; and each $R^2$ and $R^3$ is independently $(C_1-C_2)$alkyl; (iv) each $R^1$ is vinyl; and each $R^2$ and $R^3$ is methyl; (v) each $R^1$ is allyl; and each $R^2$ and $R^3$ is independently $(C_1-C_2)$alkyl; (vi) each $R^1$ is allyl; and each $R^2$ and $R^3$ is methyl;

In certain embodiments, the monocyclic organosilazane of formula (I) is an alkenyl-functional monocyclic organosilazane.

In certain embodiments, the monocyclic organosilazane of formula (I) is a molecule containing a single ring substructure composed of silicon and Nitrogen atoms disposed in an alternating arrangement; and unsaturated organo groups; and optionally H, saturated or aromatic substituent groups; wherein there are at least two unsaturated organo groups and each of at least two silicon atoms in the ring substructure have at least one unsaturated organo group bonded thereto and wherein after accounting for the unsaturated organo groups any remaining valences of the silicon atoms and Nitrogen atoms are bonded to the H, saturated or aromatic substituent groups; or collection of such molecules.

The monocyclic organosilazane of formula (I) may be a monocyclic organosilazane composed of a 6-membered ring (n=3), an 8-membered ring (n=4), a 10-membered ring (n=5), or a 12-membered ring (n=6). The ring substructure is composed of units of formula (I): $[R^1,R^2SiN(R^3)_{2/2}]_n$ (I), wherein subscript n, $R^1$ $R^2$ and $R^3$ are as defined earlier. In each $[R^1,R^2SiN(R^3)_{2/2}]_n$ unit, its $R^1$ and $R^2$ groups are bonded to its silicon atom, $R^3$ is bonded to its Nitrogen atom. In some aspects, $R^1$ and $R^2$ are the same, alternatively different.

In certain embodiments, the co-agent of the present composition is composed only of the monocyclic organosilazane of formula (I).

The amount of the monocyclic organosilazane of formula (I) in the present composition may be a crosslinking effective amount. The term "crosslinking effective amount" means a quantity (e.g., wt %) that is sufficient under the circumstances to enable crosslinking polyolefin macromolecules via multivalent crosslinker groups derived from the monocyclic organosilazane of formula (I). The circumstances may include loading level (wt %) of the monocyclic organosilazane of formula (I), loading level (wt %) of the organic peroxide in peroxide curing embodiments, or the irradiation dosage in irradiation curing embodiments. A crosslinking effective amount of the monocyclic organosilazane of formula (I) gives a greater extent of crosslinking, at a particular loading level (wt %) of an organic peroxide or at a particular dosage level of irradiation, than a comparative composition that is free of the monocyclic organosilazane of formula (I). The circumstances may also depend on the total amount, if any, of other components or any optional additive present in the present composition.

Regarding determining the crosslinking effective amount of the co-agent of the present composition, the presence of crosslinking may be detected by an increase in torque using a moving die rheometer (MDR). In some aspects the presence of crosslinking may be detected as a percentage solvent extraction (Ext %). Ext %=W1/Wo*100%, wherein W1 is the weight after extraction, Wo is original weight before extraction, / indicates division, and * indicates multiplication. The absence of, or a reduced level of, the carbon-carbon double bond of the unsaturated organogroup $R^1$) of the monocyclic organosilazane of formula (I) in the crosslinked polyolefin product (due to a coupling with the (A) polyolefin polymer) may be detected by carbon-13 or silicon-29 nuclear magnetic resonance (13C-NMR spectroscopy and/or 29Si-NMR) spectroscopy.

In certain embodiments, the composition of this disclosure comprises from 0.01 wt % to 5 wt % (e.g., from 0.05 wt % to 4.5 wt %, from 0.1 wt % to 4 wt %, from 0.15 wt % to 3.5 wt %, from 0.2 wt % to 3 wt %, from 0.25 wt % to 2.5 wt %, from 0.3 wt % to 2 wt %, from 0.35 wt % to 1.5 wt %, from 0.4 wt % to 1.25 wt %, from 0.45 wt % to 1 wt %, from 0.5 wt % to 1 wt %, etc.) of the co-agent comprising the monocyclic organosilazane of formula (I). Said in another way, the composition of this disclosure comprises from 0.01 wt %, or 0.05 wt %, or 0.1 wt %, or 0.15 wt %, or 0.2 wt %, or 0.25 wt %, or 0.3 wt %, or 0.35 wt %, or 0.4 wt %, or 0.45 wt %, or 0.5 wt % to 1 wt %, or 1.25 wt %, or 1.5 wt %, or 2 wt %, or 2.5 wt %, or 3 wt %, or 3.5 wt %, or 4 wt %, or 4.5 wt %, or 5 wt % of the co-agent comprising the monocyclic organosilazane of formula (I).

In certain embodiments, the present composition comprises a co-agent comprising the monocyclic organosilazane of formula (I) with the proviso that the composition is free of (i.e., lacks) a phosphazene base. In certain embodiments, the present composition is free of any ring opening catalyst. In further embodiments, when the polyolefin polymer is an ethylene-containing polymer and subscript n (of the monocyclic organosilazane of formula (I)) is 4, the present composition does not contain 2.4 wt % or more of, alternatively does not contain 22 wt % or more of, alternatively does not contain 20.0 wt % or more of, alternatively does not contain 15 wt % or more of, alternatively does not contain 10 wt % or more of, alternatively is free of an inorganic filler selected from the group consisting of aluminum oxide, aluminum silicate, calcium silicate, magnesium silicate, silica, titanium dioxide, and mixtures thereof. In further embodiments, the present composition does not contain 20 wt % or more of, alternatively does not contain 15 wt % or more of, alternatively does not contain 10 wt % or more of, alternatively is free of any inorganic filler selected from the group consisting of: solids containing Al, solids containing Ca, solids containing Mg, solids containing Si, solids containing Ti, and mixtures thereof. In further embodiments, the present composition is free of a silsesquioxane, alternatively any siloxane. In some aspects, the present composition is free of a silsesquioxane and any one of the abovementioned groups of inorganic fillers.

In certain embodiments, the monocyclic organosilazane of formula (I) overcomes certain limitations of conventional co-agents. For example, a conventional co-agent typically has limited solubility or miscibility in polyolefin compositions. This limits the co-agent's maximum loading level in the composition. It also causes the co-agent to undesirably migrate to the surface of the composition (e.g., surface of pellets), limiting the composition's storage lifetime. Conventional co-agents also pose other problems. For example, upon curing they may yield crosslinked products with insufficient extent of crosslinking. Or, the compositions may cure too slowly for use in certain manufacturing operations. Or the compositions may cure prematurely (i.e., to be prone to scorch during injection molding and film extrusion). Not surprisingly, these problems have limited the structures of conventional co-agents that have been used with polyolefins.

Typically, conventional co-agents comprise conventional substructural groups bonded to two or more olefinic crosslinking groups. The conventional substructural groups are acyclic or cyclic multivalent groups that comprise a backbone or ring, respectively, containing in the backbone or ring carbon atoms and, optionally, nitrogen and/or oxygen atoms, but not silicon atoms.

(E) Optional Additives

In an embodiment, the present composition includes one or more optional additives. Non-limiting examples of suitable additives include antioxidants, anti-blocking agents, stabilizing agents, colorants, ultra-violet (UV) absorbers or stabilizers, flame retardants, compatibilizers, fillers, hindered amine stabilizers, tree retardants, methyl radical scavengers, scorch retardants, nucleating agents, carbon black, and processing aids.

The optional additives are present in an amount of from greater than zero, or 0.01 wt %, or 0.1 wt % to 1 wt %, or 2 wt %, or 3 wt %, or 5 wt % based on the total weight of the present composition.

Encapsulant Films

In certain embodiments, this disclosure relates to an encapsulant film comprising a curable composition comprising: (A) a polyolefin polymer, (B) an organic peroxide, (C) a silane coupling agent, and (D) a co-agent comprising a monocyclic organosilazane of formula (I). In some embodiments, the curable composition forms the entirety of the encapsulant film.

In certain embodiments, this disclosure relates to an encapsulant film comprising a crosslinked polymeric composition comprising the reaction product of: (A) a polyolefin polymer, (B) an organic peroxide, (C) a silane coupling agent, and (D) a co-agent comprising a monocyclic organosilazane of formula (I). In some embodiments, the crosslinked polymeric composition forms the entirety of the encapsulant film.

In certain embodiments, this disclosure relates to a process for forming an encapsulant film comprising a curable composition or a crosslinked polymeric composition. In certain embodiments, the (A) polyolefin polymer, (B) organic peroxide, (C) silane coupling agent, (D) co-agent comprising the monocyclic organosilazane of formula (I), and any optional additives can be added to or combined with each other in any order or simultaneously and via any method known in the art (e.g., soaking, compounding, etc.). In some embodiments, the (B) organic peroxide, (C) silane coupling agent, (D) co-agent comprising the monocyclic organosilazane of formula (I), and any optional additives are pre-mixed, and the pre-mix is added to the (A) polyolefin polymer before or during further processing (e.g., compounding, extruding, molding, etc.) via any method known in the art. In some embodiments, dry pellets of the (A) polyolefin polymer are soaked in the pre-mix (i.e., curing package composed of the (B) organic peroxide, (C) silane coupling agent, (D) co-agent comprising the monocyclic organosilazane of formula (I), and any optional additives) and the soaked pellets are then further processed (e.g., compounded, extruded, molded, etc.). In certain embodiments, the crosslinked polymeric compositions and encapsulant films of this disclosure are formed by film extrusion or compression molding.

In some embodiments, this disclosure relates to a process for forming an encapsulant film, the process comprising (a) soaking the (A) polyolefin polymer with a pre-mix to form a soaked polyolefin polymer, wherein the premix comprises the (B) organic peroxide, (C) silane coupling agent, and (D) co-agent comprising the monocyclic organosilazane of formula (I). In further embodiments, step (a) is performed at a temperature of from 0° C. to 100° C. (e.g., from 5° C. to 75° C., from 10° C. to 50° C., from 15° C. to 45° C., from 20° C. to 40° C., etc.). In further embodiments, step (a) is performed for a duration (i.e., a soaking time) of from 0 min to 250 min (e.g., from 0 min to 225 min, from 25 min to 200 min, from 50 min to 200 min, from 50 min to 190 min, etc.).

Dry pellets of a polyolefin polymer that are soaked with a curing package comprising a conventional co-agent (e.g., triallyl isocyanurate (TAIC)) require a lengthy soaking time (up to 16 hours) for complete soaking of the pellets, thereby resulting in limited productivity and increased manufacturing costs. "Complete soaking" as defined herein refers to a soaking percentage of from greater than 90% to 100% (e.g., greater than or equal to 93%, greater than or equal to 95%, greater than or equal to 97%, greater than or equal to 98%, etc.). "Soaking percentage," as defined herein, refers to the following: $(X3-X2)/X1*100\%$, where $X1$ is the total weight of the pre-mix (composed of the organic peroxide, the silane coupling agent, and the co-agent comprising the monocyclic organosilazane of formula (I)), $X2$ is the weight of the dry pellets of the polyolefin polymer prior to soaking step (a), $X3$ is the weight of the pellets of the polyolefin polymer after soaking step (a) for a certain soaking time, / indicates division, and * indicates multiplication.

Surprisingly, the soaking time required for complete soaking of the (A) polyolefin polymer is significantly reduced when a conventional co-agent is replaced with a co-agent comprising the monocyclic silazane of formula (I). For example, in certain embodiments, a soaking percentage of greater than 90% may be achieved when step (a) of the process is performed for a duration of less than 190 minutes at room temperature. In further embodiments, a soaking percentage of greater than or equal to 99% may be achieved when step (a) of the process is performed for a duration of less than 225 minutes at room temperature. In further embodiments, a soaking percentage of greater than or equal to 97% may be achieved when step (a) of the process is performed for a duration of equal to or less than 50 minutes at 40° C. In further embodiments, a soaking percentage of greater than 99% may be achieved when step (a) of the process is performed for a duration of equal to or less than 80 minutes at 40° C.

Furthermore, unexpectedly, other performances required for forming an encapsulant film (e.g., curing performance, adhesion, volume resistivity, etc.) are maintained or improved when a conventional co-agent is replaced with a co-agent comprising the monocyclic organosilazane of formula (I).

In certain embodiments, the soaked pellets of the (A) polyolefin polymer are cured during further processing (e.g., compounding, extrusion, molding, etc.). Accordingly, in certain embodiments, the process for forming an encapsulant film further comprises: (2) curing and further processing the soaked polyolefin polymer to form the encapsulant film. In this regard, the temperature during further processing of the soaked polyolefin polymer is from 80° C., or 90° C. to 100° C., or 110° C., or 120° C., or 130° C., or 140° C., or 150° C., or 160° C., or 170° C.

In further embodiments, it is desirable to avoid or limit curing until other steps, such as lamination, as discussed below. Premature crosslinking and/or premature decomposition of the organic peroxide may result in the encapsulant film having decreased glass adhesion. In other words, the encapsulant film comprising a curable composition remains reactive until lamination, at which point crosslinking is completed and the crosslinked polymeric composition of the encapsulant film becomes a reaction product of the polyolefin polymer, the organic peroxide, the silane coupling agent, and the co-agent comprising the monocyclic organosilazane of formula (I). Accordingly, in further embodiments, the process for forming an encapsulant film further comprises: (2) further processing the soaked polyolefin polymer to form a curable film. Subsequent steps include but are not limited to: curing the curable film to form the encapsulant film, or curing the curable film during a lamination step to form the encapsulant film.

The temperature for further processing the soaked polyolefin polymer may therefore be less than the decomposition temperature of the organic peroxide. In some embodiments, the temperature during further processing of the soaked polyolefin polymer from 80° C., or 90° C. to 100° C., or 110° C., or 120° C.

Curing as discussed herein may be free-radical curing via irradiation of the present composition with a curing effective dose of irradiation and/or heating the present composition at a curing effect temperature with an organic peroxide in such a way as to react the (A) polyolefin polymer with the (D) co-agent, thereby forming a crosslinked product. The combination of the crosslinking effective amount of the co-agent comprising the monocyclic organosilazane having formula (I) with the curing effective dose of irradiation or the curing effective temperature, and any other desired reaction conditions (e.g., pressure or inert gas atmosphere) is sufficient to cure the present composition and make the crosslinked polymeric composition of the encapsulant film. The source of irradiation may be an electron beam, gamma radiation, ultraviolet light, or any combination thereof.

Unpredictably, the present composition comprising a co-agent comprising the monocyclic organosilazane of formula (I) improves upon or maintains properties relating to crosslinking relative to a comparative polyolefin composition free of the monocyclic organosilazane of formula (I). Such properties include but are not limited to the following: the time period for achieving 90% crosslinking ("t90") in a crosslinked polyolefin product, which indicates the curing rate; the greater maximum torque value ("MH"), which indicates the extent of crosslinking in a crosslinked polyolefin product; the time to scorch ("ts1"), which indicates the resistance to premature curing of a polyolefin composition during extrusion (e.g., curing in an extruder instead of in a post-extruder operation); and/or the ability of a co-agent to be loaded into a polyolefin composition at greater concentrations without "sweat out" of the co-agent during storage of the polyolefin composition over a period of time, which indicates compatibility and/or solubility of the co-agent in the polyolefin composition.

Encapsulant Film 1: In an embodiment, the encapsulant film is composed of a curable composition comprising (or a crosslinked polymeric composition comprising the reaction product of): (A) a polyolefin polymer, (B) an organic peroxide, (C) a silane coupling agent, and (D) a co-agent comprising a monocyclic organosilazane of formula (I).

Encapsulant Film 2: In an embodiment, the encapsulant film is composed of a curable composition comprising (or a crosslinked polymeric composition comprising the reaction product of): (A) from 80 wt %, or 85 wt %, or 88 wt %, or 90 wt %, or 95 wt %, or 97 wt %, or 97.50 wt %, or from 97.75 wt % to 98.25 wt %, or 98.5 wt %, or 99 wt %, or 99.88 wt %, or 99.99 wt % of a polyolefin polymer, (B) from 0.1 wt %, or 0.5 wt %, or 1 wt % to 1.5 wt %, or 2 wt %, or 2.5 wt %, or 3 wt % of an organic peroxide, (C) from 0.01 wt %, or 0.05 wt %, or 0.10 wt %, or 0.15 wt %, or 0.20 wt %, or 0.25 wt % to 0.3 wt %, or 0.4 wt %, or 0.5 wt %, or 1 wt %, or 1.5 wt %, or 2 wt % of a silane coupling agent, (D) from 0.01 wt %, or 0.05 wt %, or 0.10 wt %, or 0.15 wt %, or 0.20 wt %, or 0.2.5 wt %, or 0.30 wt %, or 0.35 wt %, or 0.40 wt %, or 0.45 wt %, or 0.50 wt % to 1 wt %, or 1.25 wt %, or 1.5 wt %, or 2 wt %, or 2.5 wt %, or 3 wt %, or 3.5 wt %, or 4 wt %, or 4.5 wt %, or 5 wt % of a co-agent comprising a monocyclic organosilazane of formula (I). It is understood that the aggregate amount of component (A), (B), (C), (D) and any optional additives yields 100 wt % of the composition.

Encapsulant Film 3: In an embodiment, the encapsulant film is composed of a curable composition comprising (or a crosslinked polymeric composition comprising the reaction product of): (A) from 95 wt % to 99 wt % of a polyolefin polymer, (B) from 0.5 wt % to 2 wt % of an organic peroxide, (C) from 0.1 wt %, to 0.5 wt % of a silane coupling agent, (D) from 0.2 wt % to 1 wt % of a co-agent comprising a monocyclic organosilazane of formula (I). It is understood that the aggregate amount of component (A), (B), (C), (D) and any optional additives yields 100 wt % of the composition.

In certain embodiments, the encapsulant film of this disclosure is according to Encapsulant Film 1, Encapsulant Film 2, or Encapsulant Film 3 having one, some, or all of the properties discussed hereinafter regarding volume resistivity and glass adhesion.

In certain embodiments, the encapsulant film is according to Encapsulant Film 1, Encapsulant Film 2, or Encapsulant Film 3 having a volume resistivity of from $1.0*10^{14}$ ohm-cm to $1.0*10^{18}$ ohm-cm (e.g., from $1.0*10^{15}$ ohm-cm to $1.0*10^{18}$ ohm-cm, from $1.0*10^{16}$ ohm-cm to $1.0*10^{18}$ ohm-cm, from $1.0*10^{17}$ ohm-cm to $1.0*10^{18}$ ohm-cm, from $1.0*10^{17}$ ohm-cm to $10.0*10^{17}$ ohm-cm, from $1.0*10^{17}$ ohm-cm to $8.0*10^{17}$ ohm-cm, $1.0*10^{17}$ ohm-cm to $7.0*10^{17}$ ohm-cm, from $1.0*10^{17}$ ohm-cm to $6.0*10^{17}$ ohm-cm, from $1.0*10^{17}$ ohm-cm to $5.0*10^{17}$ ohm-cm, from $1.0*10^{17}$ ohm-cm to $4.0*10^{17}$ ohm-cm, from $1.0*10^{17}$ ohm-cm to $3.0*10^{17}$ ohm-cm, from $1.5*10^{17}$ ohm-cm to $2.5*10^{17}$ ohm-cm, from $1.6*10^{17}$ ohm-cm to $2.1*10^{17}$ ohm-cm, etc.) at room temperature. In certain embodiments, the encapsulant film is according to Encapsulant Film 1, Encapsulant Film 2, or Encapsulant Film 3 having a volume resistivity of greater than $1.0*10^{14}$ ohm-cm (e.g., greater than $1.0*10^{15}$ ohm-cm, greater than $1.0*10^{16}$ ohm-cm greater than $1.0*10^{17}$ ohm-cm, greater than $1.5*10^{17}$ ohm-cm, greater than or equal to $1.6*10^{17}$ ohm-cm, greater than or equal to $2.1*10^{17}$ ohm-cm, etc.) at room temperature.

In certain embodiments, the encapsulant film is according to Encapsulant Film 1, Encapsulant Film 2, or Encapsulant Film 3 having a volume resistivity of from $1.0*10^{14}$ ohm-cm to $1.0*10^{18}$ ohm-cm (e.g., from $1.0*10^{15}$ ohm-cm to $1.0*10^{17}$ ohm-cm, from $1.0*10^{15}$ ohm-cm to $1.0*10^{16}$ ohm-cm, from $1.0*10^{15}$ ohm-cm to $20.0*10^{15}$ ohm-cm, from $2.0*10^{15}$ ohm-cm to $15.0*10^{15}$ ohm-cm $3.0*10^{15}$ ohm-cm to $10.0*10^{15}$ ohm-cm, from $4.0*10^{15}$ ohm-cm to $9.0*10^{15}$ ohm-cm, from $5.0*10^{15}$ ohm-cm to $8.0*10^{15}$ ohm-cm, from $5.5*10^{15}$ ohm-cm to $7.5*10^{15}$ ohm-cm, from $5.6*10^{15}$ ohm-cm to $7.3*10^{15}$ ohm-cm, etc.) at 60° C. In certain embodiments, the encapsulant film is according to Encapsulant Film 1, Encapsulant Film 2, or Encapsulant Film 3 having a volume resistivity of greater than $1.0*10^{14}$ ohm-cm (e.g., greater than $1.0*10^{15}$ ohm-cm, greater than $5.0*10^{15}$ ohm-cm, greater than or equal to $5.6*10^{15}$ ohm-cm, greater than or equal to $6.0*10^{15}$ ohm-cm, greater than or equal to $6.5*10^{15}$ ohm-cm, 60° C. greater than or equal to $7.0*10^{15}$ ohm-cm, greater than or equal to $7.3*10^{15}$ ohm-cm, etc.) at 60° C.

In certain embodiments, the encapsulant film is according to Encapsulant Film 1, Encapsulant Film 2, or Encapsulant Film 3 having a glass adhesion of greater than 60 N/cm (e.g., greater than 70 N/cm, greater than 80 N/cm, greater than 90 N/cm, greater than 100 N/cm, etc.).

The encapsulant film of the present disclosure may have any thickness.

In an embodiment, the encapsulant film is one layer, wherein the single layer is composed of the present composition. In an embodiment, the encapsulant film has two or more layers, wherein at least one layer is composed of the present composition.

Electronic Devices

An encapsulant film of this disclosure is used to construct an electronic device module. The encapsulant film is used as one or more "skins" for the electronic device, i.e., applied to one or both face surfaces of an electronic device, e.g., as a front encapsulant film or rear encapsulant film, or as both the front encapsulant film and the rear encapsulant film, e.g., in which the device is totally enclosed within the material.

In an embodiment, the electronic device module comprises (i) at least one electronic device, typically a plurality of such devices arrayed in a linear or planar pattern, (ii) at least one cover sheet, and (iii) at least one encapsulant film according to this disclosure. The encapsulant film is between the cover sheet and the electronic device, and the encapsulant film exhibits good adhesion to both the electronic device and the cover sheet.

In an embodiment, the electronic device module comprises (i) at least one electronic device, typically a plurality of such devices arrayed in a linear or planar pattern, (ii) a front cover sheet, (iii) a front encapsulant film, (iv) a rear encapsulant film, and (v) a backsheet, with at least one of the (iii) front encapsulant film and (iv) rear encapsulant film being an encapsulant film of this disclosure. The electronic device is sandwiched between the front encapsulant film and the rear encapsulant film with the cover sheet and backsheet enclosing the front encapsulant film/electronic device/rear encapsulant film unit.

In an embodiment, the cover sheet is glass, acrylic resin, polycarbonate, polyester or fluorine-containing resin. In a further embodiment, the cover sheet is glass.

In an embodiment, the back sheet is a single or multilayer film composed of glass, metal, or a polymeric resin. The back sheet is a film composed of glass or a polymeric resin. In a further embodiment, the back sheet is a multilayer film composed of a fluorine polymer layer and a polyethylene terephthalate layer.

In an embodiment, the electronic device is a solar cell or photovoltaic (PV) cell.

In an embodiment, the electronic device module is a PV module.

FIG. 1 illustrates an exemplary PV module. The rigid PV module 10 comprises photovoltaic cell 11 (PV cell 11) surrounded or encapsulated by the front encapsulant film 12a and rear encapsulant film 12b. The glass cover sheet 13 covers a front surface of the portion of the front encapsulant film 12a disposed over PV cell 11. The backsheet 14, e.g., a second glass cover sheet or polymeric substrate, supports a rear surface of the portion of the rear encapsulant film 12b disposed on a rear surface of PV cell 11. Backsheet 14 need not be transparent if the surface of the PV cell to which it is opposed is not reactive to sunlight. In this embodiment, the encapsulant films 12a and 12b fully encapsulate PV cell 11. In the embodiment shown in FIG. 1, the front encapsulant film 12a directly contacts the glass cover sheet 13 and the rear encapsulant film 12b directly contacts the backsheet 14. The PV cell 11 is sandwiched between the front encapsulant film 12a and rear encapsulant film 12b such that the front encapsulant film 12a and rear encapsulant film 12b are both in direct contact with the PV cell 11. The front encapsulant film 12a and rear encapsulant film 12b are also in direct contact with each other in locations where there is no PV cell 11.

The encapsulant film of this disclosure can be the front encapsulant film, the rear encapsulant film, or both the front encapsulant film and rear encapsulant film. In an embodiment, the encapsulant film of this disclosure is the front encapsulant film. In another embodiment, the encapsulant film of this disclosure is both the front encapsulant film and the rear encapsulant film.

In an embodiment, the encapsulant film(s) of this disclosure are applied to an electronic device by one or more lamination techniques. Through lamination, the cover sheet is brought in direct contact with a first facial surface of the encapsulant film, and the electronic device is brought in direct contact with a second facial surface of the encapsulant film. The cover sheet is brought into direct contact with a first facial surface of the front encapsulant film, the back sheet is brought in direct contact with a second facial surface of the rear encapsulant film, and the electronic device(s) is secured between, and in direct contact with the second facial surface of the front encapsulant film and the first facial surface of the rear encapsulant film.

In an embodiment, the lamination temperature is sufficient to activate the organic peroxide and crosslink the composition, that is, the curable composition comprising the polyolefin polymer, organic peroxide, silane coupling agent, and co-agent comprising a monocyclic organosilazane of formula (I) remains reactive until lamination when crosslinking occurs. During crosslinking, the silane coupling agent forms a chemical bond between two or more of the molecular chains of the polyolefin polymer by way of a silane linkage. A "silane linkage" has the structure —Si—O—Si—. Each silane linkage may connect two or more, or three or more, molecular chains of the polyolefin polymer. The silane coupling agent also interacts with the surface of the cover sheet to increase adhesion between the encapsulant film and the cover sheet. After lamination, the composition is a reaction product of the polyolefin polymer, the organic peroxide, the silane coupling agent, and the co-agent.

In an embodiment, the lamination temperature for producing an electronic device is from 130° C., or 135° C., or 140° C., or 145° C. to 150° C., or 155° C., or 160° C. In an embodiment, the lamination time is from 8 minutes, or 10 minutes, or 12 minutes, or 15 minutes to 18 minutes, or 20 minutes, or 22 minutes, or 25 minutes.

In an embodiment, the electronic device of this disclosure includes an encapsulant film composed of a crosslinked polymeric composition which is the reaction product of (A) a polyolefin polymer, (B) an organic peroxide, (C) a silane coupling agent, and (D) a co-agent comprising a monocyclic organosilazane of formula (I) and the encapsulant film has an initial glass adhesion of from greater than 60 N/cm (e.g., greater than 70 N/cm, greater than 80 N/cm, greater than 90 N/cm, greater than 100 N/cm, etc.).

In an embodiment, the electronic device of this disclosure includes an encapsulant film according to Encapsulant Film 1, Encapsulant Film 2, or Encapsulant Film 3 having one, some, or all of the properties as it relates to volume resistivity and glass adhesion.

Some embodiments of this disclosure will now be described in detail in the following examples.

EXAMPLES

Test Methods

Density is measured in accordance with ASTM D792. The result is recorded in grams (g) per cubic centimeter (g/cc or g/cm³).

Glass transition temperature (Tg) is measured according to ASTM 07028.

Melt index (MI) is measured in accordance with ASTM D1238 at 190° C., 2.16 kg and reported in grams per 10 minutes (g/10 min).

Melting point is measured according to ASTM D3418.

Crosslinking or cure is tested using a moving die rheometer according to ASTM D5289. The moving die rheometer (MDR) is loaded with 4 grams of each sample. The MDR is run for 25 minutes at 150° C., and the time versus torque curve is provided for the samples over the given interval. The 150° C. temperature represents the module lamination temperature. The maximum torque (MH) exerted by the MDR during the 25 minute testing interval is reported in dNm. The MH usually corresponds to the torque exerted at 25 minutes. The time it takes for the torque to reach X % of MH ($t_x$) is reported in minutes. $t_x$ is a standardized measurement to understand the curing kinetics of each resin. The time to reach 90% of MH ($T_{90}$) is reported in minutes.

Glass adhesion strength (average glass adhesion strength from 1" to 2") is measured by the 180° peel test. Cuts are made through the backsheet and encapsulant film layers of each of the laminated samples (e.g., comparative example and inventive example formulations) to divide each laminated sample into three 1-inch wide strip specimens, with the strips still adhered to the glass layer. The 180° peel test is conducted on an Instron TM 5565 under controlled ambient conditions. The initial glass adhesion is tested and the results are reported in Newtons/cm. Three specimens are tested to get the average initial glass adhesion strength for each sample.

The volume resistivity is tested according to the following, which is based on ASTM D257. The measurement is made using a Keithley 6517 B electrometer, combined with the Keithley 8009 test fixture. The Keithley model 8009 test chamber is located inside the forced air oven and is capable of operating at elevated temperatures (the maximum temperature of the oven is 80° C.). The leakage current is directly read from the instrument and the following equation is used to calculate the volume resistivity:

$$\rho = \frac{V \times A}{I \times t}$$

where ρ is the volume resistivity (ohm-cm), V is applied voltage (volts), A is electrode contact area (cm²), I is the leakage current (amps) and t is the average thickness of the sample. To get the average thickness of the samples, the thickness of each sample is measured before the tests, with five points of the sample measured to get an average thickness. The volume resistivity test is conducted at 1000 volts at room temperature (RT) and at 60° C. Two compression molded encapsulant films are tested to get the average.

Materials

The following materials are used to prepare the examples of this disclosure.

POE: an ethylene/octene copolymer having a density of 0.880 g/cc (ASTM D782) and a melt index of 18.0 g/10 min (ASTM D1238 at 190° C., 2.16 kg) available from The Dow Chemical Company.

TBEC: tert-butylperoxy 2-ethylhexyl carbonate, an organic peroxide available from J&K Scientific Ltd.

VMMS: 3-(trimethoxysilyl)propylmethacrylate, a silane coupling agent available from Dow Corning.

TAIC: triallyl isocyanurate, a conventional co-agent available from Fangruida Chemicals Co., Ltd., having the following structure:

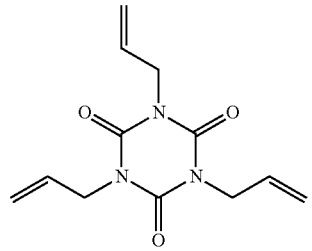

Triallyl Isocyanurate (TAIC)

TMTVCS: 2,4,6-trimethyl-2,4,6-trivinylcyclotrisilazane, a co-agent available from TCI Chemicals and having the following structure:

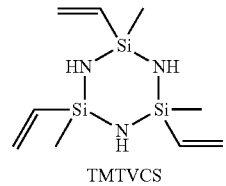

TMTVCS

Sample Preparation

Soaking: Compositions are prepared according to the formulations of Table 1, below, by first pre-mixing the organic peroxide, silane coupling agent and co-agent at the desired weight percentages set forth in Table 1 in a sealable bottle. The total weight of the organic peroxide, silane coupling agent, and co-agent for each composition is recorded as X1. Dry pellets of POE, depending on the example (see Table 1), are weighed (the weight of the dry pellets for each composition is recorded as X2) and then put into the bottle for soaking. To ensure a homogenous distribution and complete soaking of the curing package (i.e., organic peroxide, silane coupling agent and co-agent) into the pellets, the bottle is tumbled for 1 minute and then placed on a roller at room temperature (RT) or 40° C. for a certain period of time (see Tables 2 and 3). After a certain period of time (see Tables 2 and 3), the pellets are taken out from the bottles, and the surface of the pellets are wiped sufficiently using paper until no wetness can be found on the used paper. The wiped pellets are then weighed and recorded as X3. The soaking percentages are then determined via the following equation discussed above: (X3−X2)/X1*100%.

Tables 2 and 3 provide the soaking percentages determined by the above equation at certain periods of time for each example at room temperature and 40° C., respectively. Such soaking percentages are also provided in the soaking curve of FIG. 2.

TABLE 1

|  | Ex. A | Ex. 1 | Ex. 2 |
|---|---|---|---|
| Formulation (wt %) | | | |
| POE | 98.25 | 98.25 | 97.75 |
| TBEC | 1.0 | 1.0 | 1.0 |
| VMMS | 0.25 | 0.25 | 0.25 |
| TAIC | 0.5 | — | — |
| TMTVCS | — | 0.5 | 1.0 |
| Total (wt %) | 100 | 100 | 100 |
| Measured Performance | | | |
| MH/dNm | 3.18 | 2.99 | 3.84 |
| t90/min | 12.1 | 11.8 | 10.5 |
| Volume resistivity (ohm-cm), RT | $8.6*10^{16}$ | $1.6*10^{17}$ | $2.1*10^{17}$ |
| Volume resistivity (ohm-cm), 60° C. | $4.3*10^{15}$ | $5.6*10^{15}$ | $7.3*10^{15}$ |

TABLE 2

|  | Soaking time (min) at RT | Soaking percentage |
|---|---|---|
| Ex. A | 0 | 0 |
|  | 60 | 31.88 |
|  | 140 | 56.96 |
|  | 296 | 79.54 |
|  | 420 | 84.63 |
|  | 600 | 92.91 |
|  | 840 | 97.49 |
|  | 960 | 100 |
| Ex. 1 | 0 | 0 |
|  | 30 | 45.10 |
|  | 73 | 57.90 |
|  | 107 | 73.90 |
|  | 155 | 84.90 |
|  | 189 | 92.10 |
|  | 224 | 99.10 |

TABLE 3

|  | Soaking time (min) at 40° C. | Soaking percentage |
|---|---|---|
| Ex. A | 0 | 0 |
|  | 32 | 50.04 |
|  | 62 | 69.47 |
|  | 94 | 82.60 |
|  | 132 | 85.44 |
|  | 192 | 92.46 |
|  | 304 | 99.87 |
| Ex. 1 | 0 | 0 |
|  | 10 | 35.43 |
|  | 20 | 44.52 |
|  | 30 | 71.67 |
|  | 50 | 97.03 |
|  | 70 | 97.89 |
|  | 80 | 99.66 |

Figure 2:
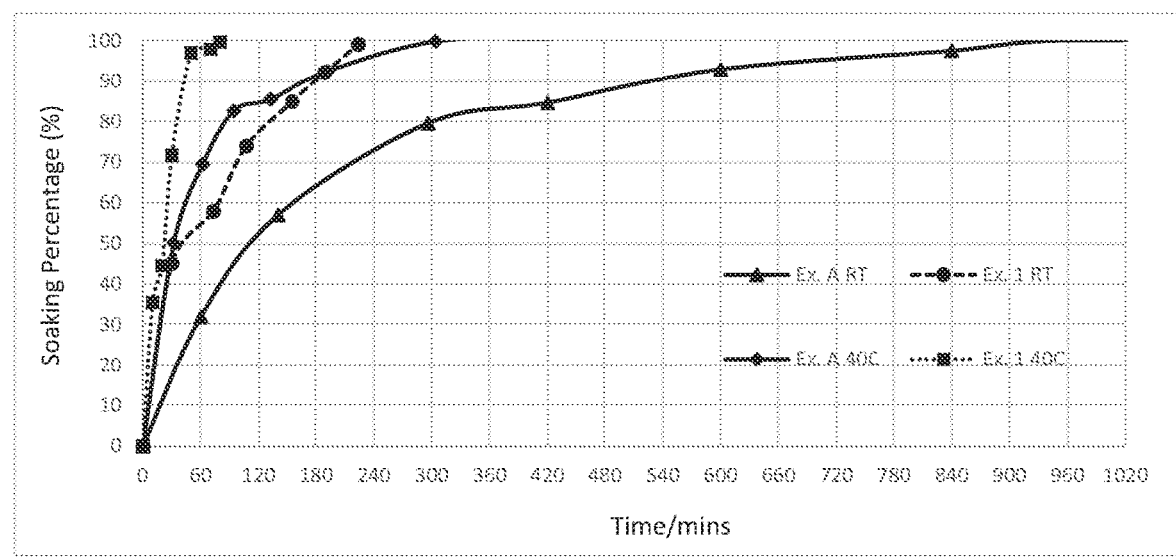
FIG. 2 is a soaking time versus soaking percentage curve for certain examples of this disclosure.

As seen in Tables 2 and 3, as well as FIG. 2, compositions comprising a conventional co-agent require a lengthy soaking time for complete soaking of the POE. Such compositions are representative of the state of the art. Surprisingly, the soaking time (at room temperature) of TMTVCS based formulations (with the same amount of co-agent and the same organic peroxide and silane coupling agent) is much shorter than that of the TAIC based formulation. Furthermore, for the invention examples, the soaking time is further reduced at 40° C. Accordingly, it has been discovered that replacing a conventional co-agent with a monocyclic organosilazane of formula (I) (e.g., TMTVCS) significantly reduces the soaking time leading to shorter overall process times for forming encapsulant films. Beyond this, as seen in Table 1, other important performance features are maintained for the inventive examples.

Compression Molding Following soaking, the soaked pellets are cured and compression molded into 0.5 mm encapsulant films. Compression molding is performed using a hydraulic press. The compositions are pre-heated at 120° C. under no applied pressure for 5 minutes followed by degassing. Subsequently, the compositions are pressed for 15 minutes at 10 M pa pressure a temperature of 150° C. to insure complete curing. Finally, the temperature is cooled to room temperature and the pressure is released. The cured, compression-molded encapsulant films are then tested for volume resistivity.

As seen in Table 1, the inventive examples provide similar or improved performance compared to TAIC-based compositions (that are representative of the state of the art) for volume resistivity and curing performance. Accordingly, this disclosure provides novel POE-based compositions that significantly shorten the soaking time of the curing package into POE, while maintaining good curing performance and volume resistivity.

What is claimed is:

1. A curable composition for forming an encapsulant film, wherein the composition comprises:
   (a) a polyolefin polymer;
   (b) an organic peroxide;
   (c) a silane coupling agent; and
   (d) a co-agent comprising a monocyclic organosilazane of formula (I):
   $[R^1R^2SiN(R^3)_{2/2}]_n$ (I), wherein subscript n is an integer greater than or equal to 3; each $R^1$ is independently a ($C_2$-$C_4$)alkenyl; and each $R^2$ and $R^3$ are independently H, ($C_1$-$C_4$)alkyl, phenyl, or $R^1$.

2. The composition of claim 1 comprising:
(a) 80 wt % to 99.88 wt % of the polyolefin polymer;
(b) from 0.1 wt % to 5 wt % of the organic peroxide;
(c) from 0.01 wt % to 2 wt % of the silane coupling agent; and
(d) from 0.01 wt % to 5 wt % of the co-agent comprising the monocyclic organosilazane of formula (I).

3. The composition of claim 1, wherein the polyolefin polymer is an ethylene/alpha-olefin copolymer comprising a density of from 0.850 g/cc to 0.890 g/cc (ASTM D792) and a melt index of from 1.0 g/10 min to 50.0 g/10 min (ASTM D1238, at 190° C./2.16 kg).

4. The composition of claim 1, wherein the monocyclic organosilazane of formula (I) is further described by any one of limitations (i) to (vi): (i) subscript n is 3; (ii) each $R^1$ is independently a $(C_2-C_3)$alkenyl; and each $R^2$ and $R^3$ is independently H, $(C_1-C_2)$alkyl, or $(C_2-C_3)$alkenyl; (iii) each $R^1$ is vinyl; and each $R^2$ and $R^3$ is independently $(C_1-C_2)$alkyl; (iv) each $R^1$ is vinyl; and each $R^2$ and $R^3$ is methyl; (v) each $R^1$ is allyl; and each $R^2$ and $R^3$ is independently $(C_1-C_2)$alkyl; (vi) each $R^1$ is allyl; and each $R^2$ and $R^3$ is methyl.

5. The composition of claim 1, wherein the monocyclic organosilazane of formula (I) is further described by any one of limitations (i) to (vi): (i) subscript n is 4; (ii) each $R^1$ is independently a $(C_2-C_3)$alkenyl; and each $R^2$ and $R^3$ is independently H, $(C_1-C_2)$alkyl, or $(C_2-C_3)$alkenyl; (iii) each $R^1$ is vinyl; and each $R^2$ and $R^3$ is independently $(C_1-C_2)$alkyl; (iv) each $R^1$ is vinyl; and each $R^2$ and $R^3$ is methyl; (v) each $R^1$ is allyl; and each $R^2$ and $R^3$ is independently $(C_1-C_2)$alkyl; (vi) each $R^1$ is allyl; and each $R^2$ and $R^3$ is methyl.

6. The composition of claim 1, wherein the monocyclic organosilazane of formula (I) is further described by any one of limitations (i) to (vi): (i) subscript n is 5 or 6; (ii) each $R^1$ is independently a $(C_2-C_3)$alkenyl; and each $R^2$ and $R^3$ is independently H, $(C_1-C_2)$alkyl, or $(C_2-C_3)$alkenyl; (iii) each $R^1$ is vinyl; and each $R^2$ and $R^3$ is independently $(C_1-C_2)$alkyl; (iv) each $R^1$ is vinyl; and each $R^2$ and $R^3$ is methyl; (v) each $R^1$ is allyl; and each $R^2$ and $R^3$ is independently $(C_1-C_2)$alkyl; (vi) each $R^1$ is allyl; and each $R^2$ and $R^3$ is methyl.

7. The composition of claim 1, wherein the monocyclic organosilazane of formula (I) is selected from the group consisting of: 2,4,6-trimethyl-2,4,6-trivinylcyclotrisilazane; 1,3,5,7-tetravinyl-1,3,5,7-tetramethylcyclotetrasilazane; and combinations thereof.

8. An encapsulant film comprising a crosslinked polymeric composition comprising the reaction product of:
(a) a polyolefin polymer;
(b) an organic peroxide;
(c) a silane coupling agent; and
(d) a co-agent comprising a monocyclic organosilazane of formula (I):
$[R^1R^2SiN(R^3)_{2/2}]_n$ (I), wherein subscript n is an integer greater than or equal to 3; each $R^1$ is independently a $(C_2-C_4)$alkenyl; and each $R^2$ and $R^3$ is independently H, $(C_1-C_4)$alkyl, phenyl, or $R^1$.

9. The encapsulant film of claim 8 comprising a crosslinked polymeric composition comprising the reaction product of:
(a) From 80 wt % to 99.88 wt % of the polyolefin polymer;
(b) from 0.1 wt % to 5 wt % of the organic peroxide;
(c) from 0.01 wt % to 2 wt % of the silane coupling agent; and
(d) from 0.01 wt % to 5 wt % of the co-agent comprising the monocyclic organosilazane of formula (I).

10. The encapsulant film of claim 8, wherein the polyolefin polymer is an ethylene/alpha-olefin copolymer comprising a density of from 0.850 g/cc to 0.890 g/cc (ASTM D792) and a melt index of from 1.0 g/10 min to 50.0 g/10 min (ASTM D1238, at 190° C./2.16 kg).

11. The encapsulant film of claim 8, wherein the monocyclic organosilazane of formula (I) is further described by any one of limitations (i) to (vi): (i) subscript n is 3; (ii) each $R^1$ is independently a $(C_2-C_3)$alkenyl; and each $R^2$ and $R^3$ is independently H, $(C_1-C_2)$alkyl, or $(C_2-C_3)$alkenyl; (iii) each $R^1$ is vinyl; and each $R^2$ and $R^3$ is independently $(C_1-C_2)$alkyl; (iv) each $R^1$ is vinyl; and each $R^2$ and $R^3$ is methyl; (v) each $R^1$ is allyl; and each $R^2$ and $R^3$ is independently $(C_1-C_2)$alkyl; (vi) each $R^1$ is allyl; and each $R^2$ and $R^3$ is methyl.

12. The encapsulant film of claim 8, wherein the monocyclic organosilazane of formula (I) is further described by any one of limitations (i) to (vi): (i) subscript n is 4; (ii) each $R^1$ is independently a $(C_2-C_3)$alkenyl; and each $R^2$ and $R^3$ is independently H, $(C_1-C_2)$alkyl, or $(C_2-C_3)$alkenyl; (iii) each $R^1$ is vinyl; and each $R^2$ and $R^3$ is independently $(C_1-C_2)$alkyl; (iv) each $R^1$ is vinyl; and each $R^2$ and $R^3$ is methyl; (v) each $R^1$ is allyl; and each $R^2$ and $R^3$ is independently $(C_1-C_2)$alkyl; (vi) each $R^1$ is allyl; and each $R^2$ and $R^3$ is methyl.

13. The encapsulant film of claim 8, wherein the monocyclic organosilazane of formula (I) is further described by any one of limitations (i) to (vi): (i) subscript n is 5 or 6; (ii) each $R^1$ is independently a $(C_2-C_3)$alkenyl; and each $R^2$ and $R^3$ is independently H, $(C_1-C_2)$alkyl, or $(C_2-C_3)$alkenyl; (iii) each $R^1$ is vinyl; and each $R^2$ and $R^3$ is independently $(C_1-C_2)$alkyl; (iv) each $R^1$ is vinyl; and each $R^2$ and $R^3$ is methyl; (v) each $R^1$ is allyl; and each $R^2$ and $R^3$ is independently $(C_1-C_2)$alkyl; (vi) each $R^1$ is allyl; and each $R^2$ and $R^3$ is methyl.

14. The encapsulant film of claim 8, wherein the monocyclic organosilazane of formula (I) is selected from the group consisting of: 2,4,6-trimethyl-2,4,6-trivinylcyclotrisilazane; 1,3,5,7-tetravinyl-1,3,5,7-tetramethylcyclotetrasilazane; and combinations thereof.

15. The encapsulant film of claim 8, further comprising a volume resistivity of greater than or equal to $1.0*10^{14}$ ohm-cm at room temperature.

16. The encapsulant film of claim 8, further comprising a volume resistivity of greater than or equal to $1.0*10^{14}$ ohm-cm at 60° C.

17. An electronic device module comprising:
an electronic device,
a cover sheet, and
the encapsulant film of claim 8.

* * * * *